United States Patent
Gordon et al.

(10) Patent No.: US 12,294,383 B1
(45) Date of Patent: May 6, 2025

(54) HIGH SPEED CHARGE MODE DIGITAL-TO-ANALOG CONVERTER

(71) Applicant: MELLANOX TECHNOLOGIES, LTD., Yokneam (IL)

(72) Inventors: Eshel Gordon, Aloney Aba (IL); Boris Sharav, Yoqneam (IL); Roi Levi, Bruchin (IL); Ayal Eshkoli, Kiryat Tivon (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 17/151,348

(22) Filed: Jan. 18, 2021

(51) Int. Cl.
*H03M 1/66* (2006.01)
*H02H 9/04* (2006.01)
*H03M 1/36* (2006.01)
*H03M 1/68* (2006.01)
*H03M 3/00* (2006.01)

(52) U.S. Cl.
CPC .............. *H03M 1/68* (2013.01); *H02H 9/046* (2013.01); *H03M 1/36* (2013.01); *H03M 3/378* (2013.01)

(58) Field of Classification Search
CPC ...... H03M 1/804; H03M 1/662; H03M 1/468; H03M 1/466; H03M 1/765; H03M 1/66; H03M 1/0836; H03M 1/1047; H03M 1/462; H03M 1/68; H03M 1/687; H03M 1/747; H03M 1/802; H03M 1/002; H03M 1/06; H03M 1/1215; H03M 1/1245; H03M 1/365; H03M 1/38; H03M 1/667
USPC ................................ 341/141, 144, 150, 172
See application file for complete search history.

(56) References Cited

U.S. PATENT DOCUMENTS

| | | | | |
|---|---|---|---|---|
| 5,990,819 A * | 11/1999 | Fujimori | ............... | H03M 1/806 341/150 |
| 7,106,241 B1 * | 9/2006 | Felder | ................... | H03M 3/35 341/172 |
| 7,652,607 B2 * | 1/2010 | Edwards | ............... | H03M 1/002 341/145 |
| 7,741,985 B2 * | 6/2010 | Kubota | ................. | H03M 1/802 345/98 |
| 8,106,803 B2 * | 1/2012 | Hurwitz | ............... | H03M 1/765 341/172 |
| 9,178,528 B1 * | 11/2015 | Waltari | ................... | H03M 1/66 |
| 2006/0098823 A1 * | 5/2006 | Venes | ................ | H04N 7/17309 380/219 |
| 2008/0303700 A1 * | 12/2008 | Tsuchi | .................... | H03F 1/083 341/122 |
| 2011/0069777 A1 * | 3/2011 | Hurwitz | ............... | H03M 1/765 341/172 |

(Continued)

*Primary Examiner* — Linh V Nguyen
(74) *Attorney, Agent, or Firm* — Sheridan Ross P.C.

(57) ABSTRACT

A digital-to-charge converter, a digital-to-analog converter, and a method of operating a digital-to-charge converter are provided. An illustrative method of operating a digital-to-charge converter is provided that includes: receiving a digital input signal at the digital to charge converter, charging one or more capacitors during a pre-evaluation period, where the one or more capacitors are charged with a supply voltage based the digital input signal, disconnecting the one or more capacitors from the supply voltage during an evaluation period, and generating an analog output signal from the digital to charge converter based on an evaluation of charge of the one or more capacitors during the evaluation period.

19 Claims, 7 Drawing Sheets

(56) References Cited

U.S. PATENT DOCUMENTS

| | | | |
|---|---|---|---|
| 2012/0026027 A1* | 2/2012 | Steensgaard-Madsen | H03M 1/466 341/161 |
| 2012/0280841 A1* | 11/2012 | Wang | H03M 1/1295 341/172 |
| 2015/0180496 A1* | 6/2015 | Drago | H03M 1/46 341/122 |
| 2016/0056836 A1* | 2/2016 | Chubachi | H03M 1/0836 341/150 |
| 2019/0131989 A1* | 5/2019 | Maurino | H03M 3/47 |

* cited by examiner

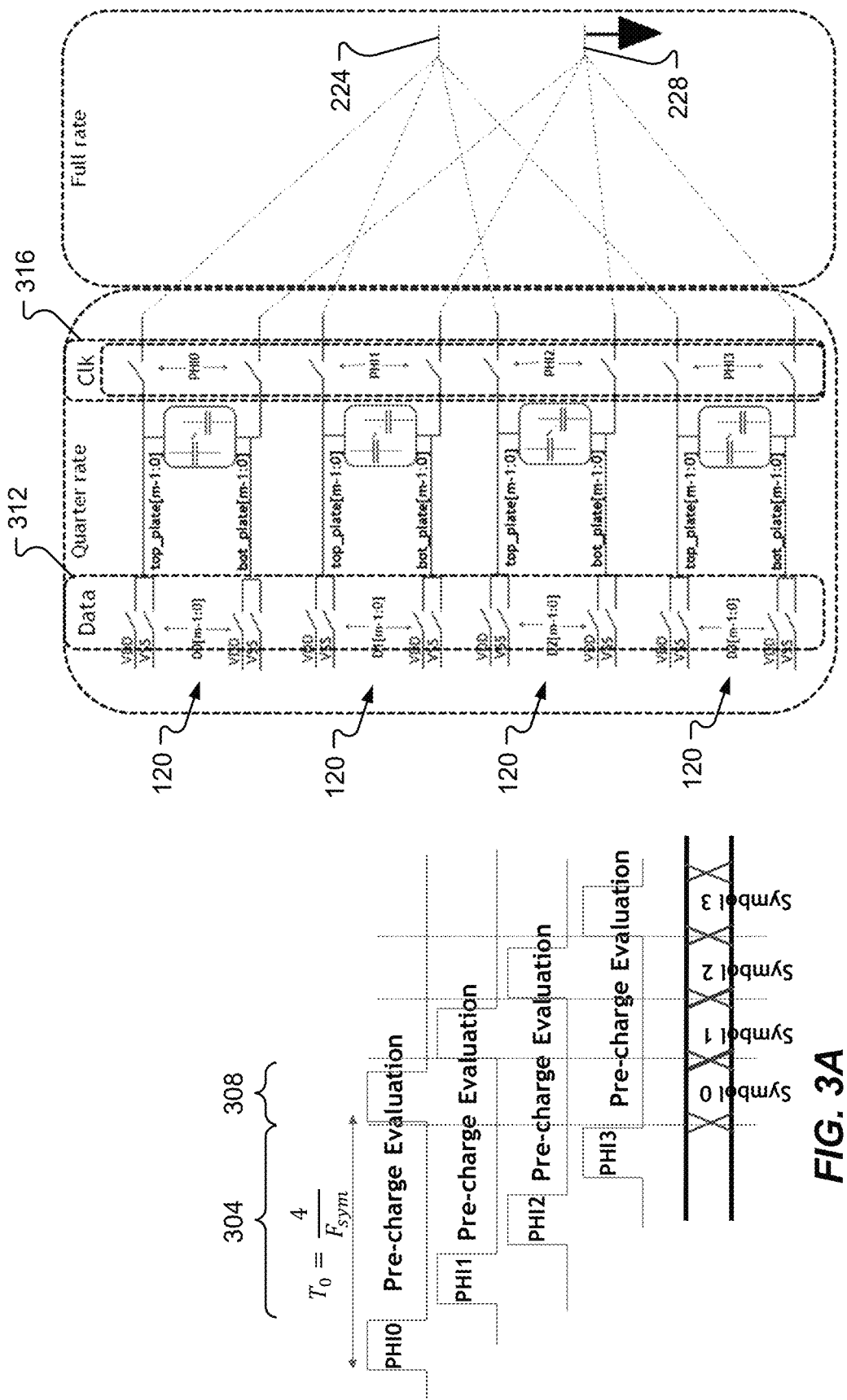

HIGH SPEED CHARGE MODE DIGITAL-TO-ANALOG CONVERTER

FIELD OF THE DISCLOSURE

The present disclosure is generally directed toward signal processing and, in particular, toward digital-to-analog converters.

BACKGROUND

High speed digital-to-analog conversion presents many challenges for Serializer/Deserializer (SerDes) design. A functional digital-to-analog converter should be designed to meet speed, swing, power, and linearity requirements.

Existing high-speed digital-to-analog converters work primarily in either a voltage mode or a current mode. Each approach has its own limitations, mainly due to the speed and the time constant of the active devices used in the converters. As an example, standard digital-to-analog converters that operate in a voltage mode suffer from several challenges. First, operating in the voltage mode makes data multiplexing difficult to implement at the output node. Multiplexing the data to a full rate and then driving the signal with a full rate driver is possible, but requires high-speed digital multiplexing, which introduces timing difficulties. Secondly, digital-to-analog converters operating in the voltage mode typically employ a resistor size that is relatively large, which introduces bandwidth limitations on the converter.

BRIEF SUMMARY

In line with the challenges mentioned above, embodiments of the present disclosure contemplate a digital-to-analog converter (DAC) that operates in a charge mode or charge domain rather than operating in a voltage mode or voltage domain. One or many digital-to-charge converters can be provided in a DAC and each digital-to-charge converter may be configured to convert 1 bit of data (e.g., b0) to a charge value Q, which may be computed based on a capacitance C and a reference voltage V. As an example, a charge quantity of $Q=CV$ may be correlated to a digital input value of $b0=1$ whereas a negative charge value $Q=-CV$ may be correlated to a digital input value of $b0=0$.

In an illustrative example, a digital-to-charge converter is disclosed that includes: an input that receives a digital input signal; circuitry that is charged based on the digital input signal and that holds the charge during a pre-evaluation period; and an output that enables evaluation of the charge held in the circuitry during an evaluation period that follows the pre-evaluation period, where the output provides an output signal in a charge domain that is based on the evaluation of the charge held in the circuitry.

In another example, a high-speed DAC is provided that is configured to convert an m-bit digital input signal into an analog output signal, the high-speed DAC is disclosed to include: an input that receives the m-bit digital input signal; an output that provides the analog output signal; and a number of charge converters provided between the input and the output, where the number of charge converters include one or more capacitors, where the one or more capacitors are charged based on the m-bit digital input signal during a pre-evaluation period, where a charge stored by the one or more capacitors is evaluated during an evaluation period that follows the pre-evaluation period, where the number of charge converters receive control signals that coordinate the evaluation period and the pre-evaluation period, and where the analog output signal is generated based on the evaluation of the charge stored by the one or more capacitors during the evaluation period.

In yet another example, a method of operating a digital-to-charge converter is disclosed that includes: receiving a digital input signal at the digital to charge converter; charging one or more capacitors during a pre-evaluation period, where the one or more capacitors are charged with a supply voltage based on the digital input signal; disconnecting the one or more capacitors from the supply voltage during an evaluation period; and generating an analog output signal from the digital to charge converter based on an evaluation of charge of the one or more capacitors during the evaluation period.

Additional features and advantages are described herein and will be apparent from the following Description and the figures.

BRIEF DESCRIPTION OF THE SEVERAL VIEWS OF THE DRAWINGS

The present disclosure is described in conjunction with the appended figures, which are not necessarily drawn to scale:

FIG. 3A illustrates a timing diagram in accordance with at least some embodiments of the present disclosure;

FIG. 3B illustrates details of a digital-to-charge conversion unit in accordance with at least some embodiments of the present disclosure;

DETAILED DESCRIPTION

Figure 1:
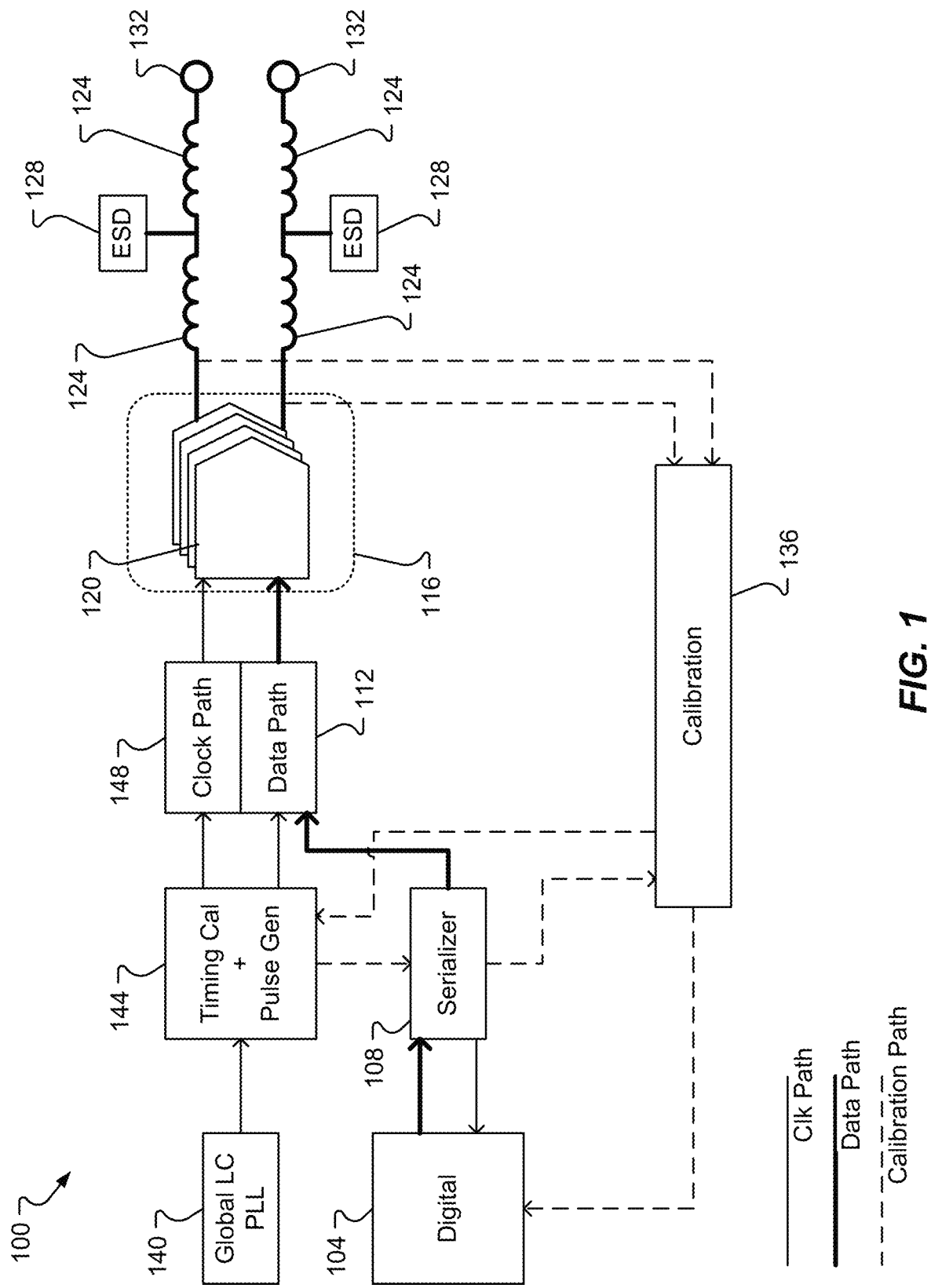
FIG. 1 is a block diagram depicting a digital-to-analog converter in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means: A alone, B alone, C alone, A and B together, A and C together, B and C together, or A, B and C together.

The term "automatic" and variations thereof, as used herein, refers to any appropriate process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," and "compute," and variations thereof, as used herein, are used interchangeably and include any appropriate type of methodology, process, operation, or technique.

Various aspects of the present disclosure will be described herein with reference to drawings that are schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-7, various systems, circuits, and methods will be described for converting a digital signal into an analog signal by operating in a charge domain rather than operating in a voltage or current domain. In some examples, a digital-to-charge converter will be described as part of a digital-to-analog converter. In other words, a digital-to-analog converter may include one or many digital-to-charger converters or converter units in accordance with at least some embodiments of the present disclosure.

In some embodiments, an m-bit digital-to-charge converter is provided as an element that converts a data vector $d[m-1:0]$ to a charge value $Q(d[m-1]:0)$. An arrangement of $2^{m-1}$ digital-to-charge converters may be configured to convert m-bits from a digital signal into charge, which can eventually be converted into an analog signal. In some examples, a digital-to-charge conversion unit may include an array of m-binary weighted capacitors and switches that are controlled by a clock signal PHI. Illustratively, the switches may be moved between open and closed states to rearrange the digital-to-charge converter between two states. In the first state, the digital-to-charge converter may be in a pre-evaluation period where capacitor(s) of the digital-to-charge converter are being charged based on the input digital signal. In the second state, the digital-to-charge converter may be in an evaluation period where charge values are measured from the capacitor(s) that were previously charged in the pre-evaluation period. As a non-limiting example, when the clock signal PHI is at a first value (e.g., when clock signal PHI is 'low'), the binary weighted capacitor array may be pre-charged with a supply voltage according to a data vector. When the clock signal PHI is at a second value (e.g., when clock signal PHI is 'high'), one set of plates of the capacitors (e.g., bottom plates) in the binary weighted capacitor array may be shorted and connected to a low impedance ground node and another set of plates (e.g., top plates) in the binary weighted capacitor array may be connected to a floating node OUT. When the clock signal PHI is at the second value, the digital-to-charge converter may be subject to an evaluation period in which charge sharing occurs across the binary weighted capacitor array and the digital data vector is converted to an output voltage. The output voltage may then be output as an analog output signal.

Embodiments of the present disclosure contemplate, as a non-limiting example, using four m-bit digital-to-charge converters and re-arranging the phases in a time interleaved fashion. Utilizing digital-to-charge converters in this way may enable a full rate high-speed DAC to be implemented. If four digital-to-charge converters are used, then the capacitor array of each digital-to-charge converter may be clocked with a phase PHI[3:0] to convert the m-size data vector D[3:0] to an output voltage. Specifically, each capacitor array may be subjected to two timing windows and the timing windows for each digital-to-charge converter may be interleaved. In a pre-evaluation period, capacitors in a particular capacitor array may be charged according to data bits and the pre-evaluation period may correspond to 3 Unit Intervals (UI). In an evaluation period, capacitors in the capacitor array may be shorted together and a data vector may be converted to voltage by a charge sharing phenomena that occurs as a result of shorting the capacitors together. The evaluation period may correspond to 1 UI, leaving three other UIs available for an evaluation of other capacitor arrays in other digital-to-charge converters.

Referring initially to FIG. 1, an illustrative circuit 100 will be described in accordance with at least some embodiments of the present disclosure. The circuit 100 is shown to include a digital signal input 104, a serializer 108, a data path 112, a DAC unit 116, and a number of output terminals 132. The circuit 100 is further shown to include a calibration circuit 136 that receives feedback from the output of the DAC unit 116 as well as feedback from the serializer 108 and provides calibration signals to the digital input 104 and a timing calibration and pulse generator 144. The timing calibration and pulse generator 144 may operate in cooperation with a phase-locked loop (PLL) unit 140 to provide a clock signal to the DAC unit 116 via a clock path 148. As shown in FIG. 1, a clock signal may be provided to the DAC unit 116 through the data path 112 and clock path 148. As a non-limiting example, if the DAC unit 116 includes four digital-to-charge converters 120, then the clock signal provided to the DAC unit 116 may have a frequency that is 0.25 times the symbol frequency.

The output terminals 132 may be connected to a load, although the load or resistance of the load is not depicted in FIG. 1. The circuit 100 may be capable of utilizing the four digital-to-charge converters 120 at a quarter clock rate along with an analog multiplexing at the output of the DAC unit 116 to produce a full rate signal that operates at speeds of 112 GBPS or higher. As will be described in further detail herein, the output impedance of the circuit 100 at the output terminals 132 may be tuned to approximately 100 ohm using a capacitor connected across the output terminals 132. Moreover, bandwidth expansion can be achieved using digital Finite Impulse Response (FIR) or a T-coil 124 as shown in FIG. 1. The output of the DAC unit 116 is also showed to be connected to one or more electrostatic discharge units 128.

Although the circuit 100 of FIG. 1 is shown to include four digital-to-charge converters 120 in the DAC unit 116, it should be appreciated that a greater or lesser number of digital-to-charge converters 120 may be provided in the DAC unit 116 without departing from the scope of the present disclosure. For example, if the DAC unit 116 were designed to include two digital-to-charge converters 120, then the clock signal provided to the DAC unit 116 may correspond to 0.5 times the symbol frequency. As another example, if the DAC unit 116 were designed to include eight digital-to-charge converters 120, then the clock signal provided to the DAC unit 116 may correspond to 0.125 times the symbol frequency. In other words, the clock signal produced at the PLL unit 140 and eventually provided to the DAC unit 116 may be inversely proportional to the symbol frequency processed by the circuit 100.

FIG. 1 illustrates various clock signal paths, data signal paths, and calibration signal paths through the circuit 100. As can be expected, the calibration signal paths may flow into and/or out of the calibration circuit 136. Meanwhile, the clock signal path may originate at the PLL unit 140, which may output a clock signal PHI[3:0], which is 0.25 times the symbol frequency of the data signal output by the DAC unit 116. As will be described in further detail herein, the data signal may flow from the digital input 104 to the serializer 108, through the data path 112 into the DAC unit 116. The data signal may include an n-channel component (nch), a p-channel component (pch), and a combination of nch and pch (dbot), which are input to the DAC unit 116.

In some embodiments, the serializer 108 operates with a drive voltage. An illustrative, but non-limiting example of a drive voltage that may be used for the serializer 108 is 0.75V. The data path 112 may operate at the same drive voltage. Comparatively, the timing calibration and pulse generator 144 and the clock path 148 may operate between a voltage range of 1.2V and 0.75V. The DAC unit 116 and the digital-to-charge converters 120 provided therein may operate between a voltage of 1.2V and 0.9V or some other voltage range that is different from the drive voltage.

Figure 2A:
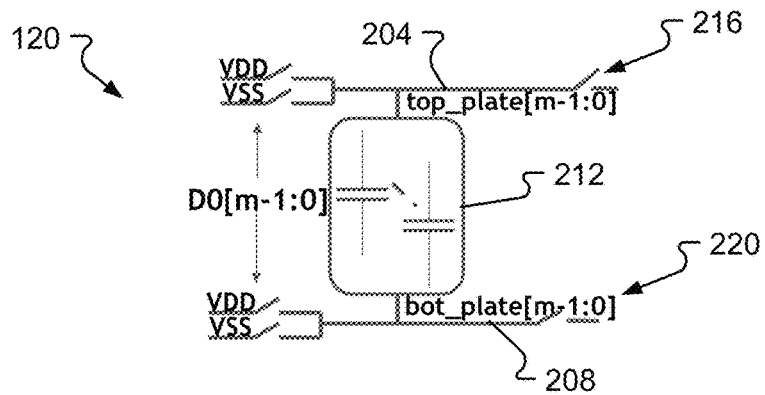
FIG. 2A illustrates details of a digital-to-charge converter in accordance with at least some embodiments of the present disclosure.
Figure 2B:
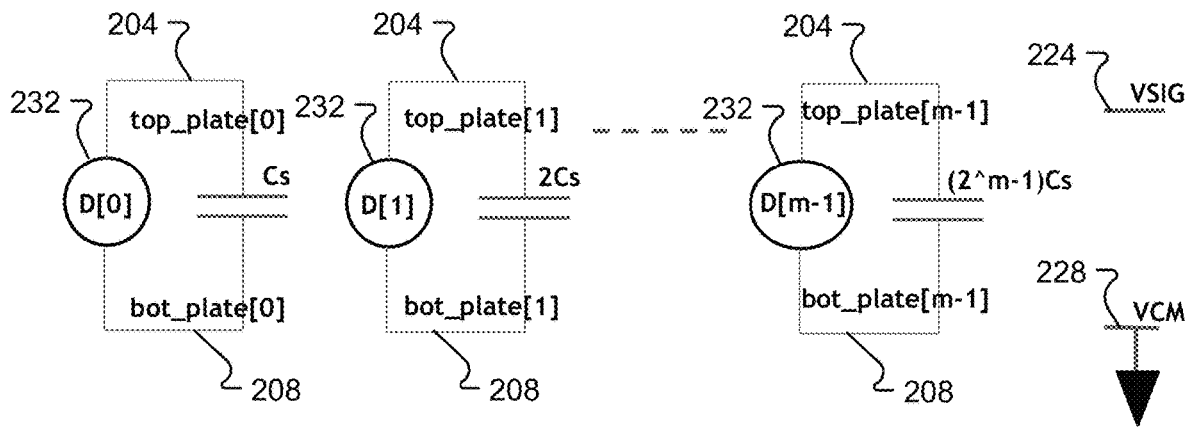
FIG. 2B illustrates a circuit configuration during a pre-evaluation period in accordance with at least some embodiments of the present disclosure.
Figure 2C:
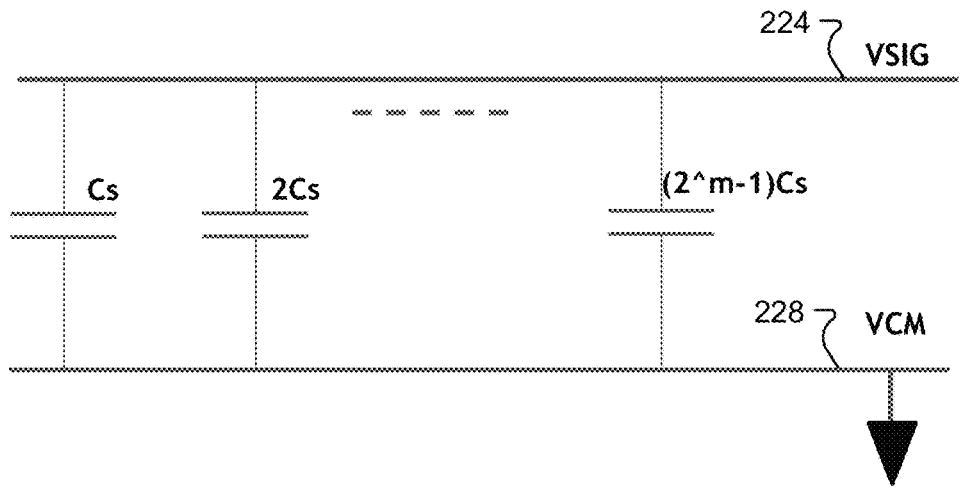
FIG. 2C illustrates a circuit configuration during an evaluation period in accordance with at least some embodiments of the present disclosure.

With reference now to FIGS. 2A-2C, additional details of a digital-to-charge converter 120 will be described in accordance with at least some embodiments of the present disclosure. The illustrative digital-to-charge converter 120 may be provided as one of many of the digital-to-charge converters 120 in the DAC unit 116. A digital-to-charge converter 120 may include an array of capacitors 212 built from m binary sized capacitors. Each capacitor in the array of capacitors 212 may have a capacitance Cs and each capacitor may have its own top plate 204 and bottom plate 208 that can be shorted to other top plates 204 and bottom plates 208 of other capacitors in the array of capacitors 112. The top plates 204 and bottom plates 208 may be selectively shorted by operation of top plate switches 216 and bottom plate switches 220. The switches 216, 220 to the array of capacitors 212 may be operated based on the clock signal PHI. The switches of the digital-to-charge converter 120 may be moved between an open position and a closed position based on the clock signal PHI and based on whether the particular digital-to-charge converter 120 is in a pre-evaluation period or in an evaluation period. Other switches that connect a supply voltage (VDD and/or VSS) to the array of capacitors 212 may be operated based on the input digital signal D[m−1:0], which may cause certain capacitors in the array of capacitors 212 to be charged during a pre-evaluation period.

FIG. 2B illustrates a configuration of the digital-to-charge converter 120 in the pre-evaluation period during which capacitors in the array of capacitors 212 are connected to the supply voltage 232, which may also be referred to as the digital data signal for a particular bit. In this configuration, the capacitors in the array of capacitors 212 are charged to +/−Vdd according to the data of the digital vector D[m−1:0]. FIG. 2C illustrates a configuration of the digital-to-charge converter 120 in the evaluation period during which top plates 204 of capacitors in the array of capacitors 212 are shorted together and connected to the floating node, which may be an output line 224 to produce an output voltage VSIG based on charge provided by each capacitor that was charged during the pre-evaluation period. Also in this configuration, all bottom plates 208 of the capacitors in the array of capacitors 212 are shorted together and connected to a common low impedance node 228 (e.g., ground or some other shared common voltage). Because the array of capacitors 212 are built from m binary sized capacitors, the charge sharing among capacitors in the array of capacitors 212 during the evaluation period will produce an output voltage VSIG that represents the m-bit digital signal that was input to the digital-to-charge converter 120 and that was used to charge the capacitors in the array of capacitors 212 during the pre-evaluation period. During a subsequent pre-evaluation period a new digital vector D[m−1:0] is provided to the array of capacitors 212 as shown in FIG. 2B, then a new output voltage VSIG will be produced during a subsequent evaluation period to represent the new digital vector D[m−1:0].

In some embodiments, the output voltage VSIG may be evaluated according to:

$$VSIG = V_{dd} \frac{C_{Vdd} - C_{-Vdd}}{C_{Total}}$$

It may also be possible to handle lower supply voltages by doubling an amplification of the supply voltage. For example, as will be described in connection with FIG. 6, two single-ended (SE) arrays 604 may be utilized within the DAC unit 116 and may be used to increase the voltage output by the DAC unit 116. In this way, a DAC unit 116 can be configured to handle lower supply voltages.

With reference now to FIGS. 3A and 3B, additional details of the timing and synchronized operation of the digital-to-charge converters 120 will be described in accordance with at least some embodiments of the present disclosure. In the example of FIGS. 3A and 3B, a DAC unit 116 is shown to include four digital-to-charge converters 120. Again, a greater or lesser number of digital-to-charge converters 120 can be provided in the DAC unit 116 without departing from the scope of the present disclosure.

The illustrated configuration of digital-to-charge converters 120 creates a high-speed DAC unit 116 capable of supporting data rates of 112 GBPS or greater. The digital-to-charge converters 120 may be time interleaved according to the timing diagram of FIG. 3A. Specifically, separation of the data domain 312 and clock domain 316 allows four symbols (e.g., Symbol 0, Symbol 1, Symbol 2, and Symbol 3) to be sequentially evaluated by different digital-to-charge converters 120 and then converted into an analog signal based on the evaluation at each digital-to-charge converter 120 during the corresponding evaluation period assigned to the digital-to-charge converter 120.

In some embodiments, the switches used to connect the supply voltage to an array of capacitors 212 are operated in the data domain 312 while the switches used to enable evaluation of charge stored in the array of capacitors 112 are operated in the clock domain 316. The clock signal PHI is provided to the DAC unit 116 via the clock path 148 while the data signal or digital vector D[m−1:0] is provided to the DAC unit 116 via the data path 112.

The period $T_0$ with which each digital-to-charge converter 120 is rotated through a pre-evaluation period 304 and evaluation period 308 may correspond to 4 (the number of digital-to-charge converters 120 in the DAC unit 116) divided by the symbol frequency $F_{sym}$. The evaluation period 308 for each digital-to-charge converter 120 may be offset from all other evaluation periods 308 of all other digital-to-charge converters 120, meaning that only one digital-to-charge converter 120 is subject to an evaluation period 308 at a time. The analog outputs of the digital-to-charge converters 120, however, may be multiplexed at the output nodes 224, 228 to bring the output of the DAC unit 116 back to a full rate. Thus, the high-speed DAC unit 116 may be allowed to have components therein operate at quarter rate speeds while still providing a full rate output.

Multiplexing the analog outputs of the digital-to-charge converters 116 is advantageous as compared to digital multiplexing because data dependent jitter is not induced with analog multiplexing. Analog multiplexing may also enable timing, gain, and offset calibration. While analog multiplexing may introduce bandwidth limitation at the multiplexing node, this possible downside is relatively easy to overcome in a charge mode topology as depicted and described herein. In other words, because the DAC unit 116 is configured to operate in the charge mode or charge domain, many of the common downsides associated with analog multiplexing can be avoided or easily corrected.

Figure 4:
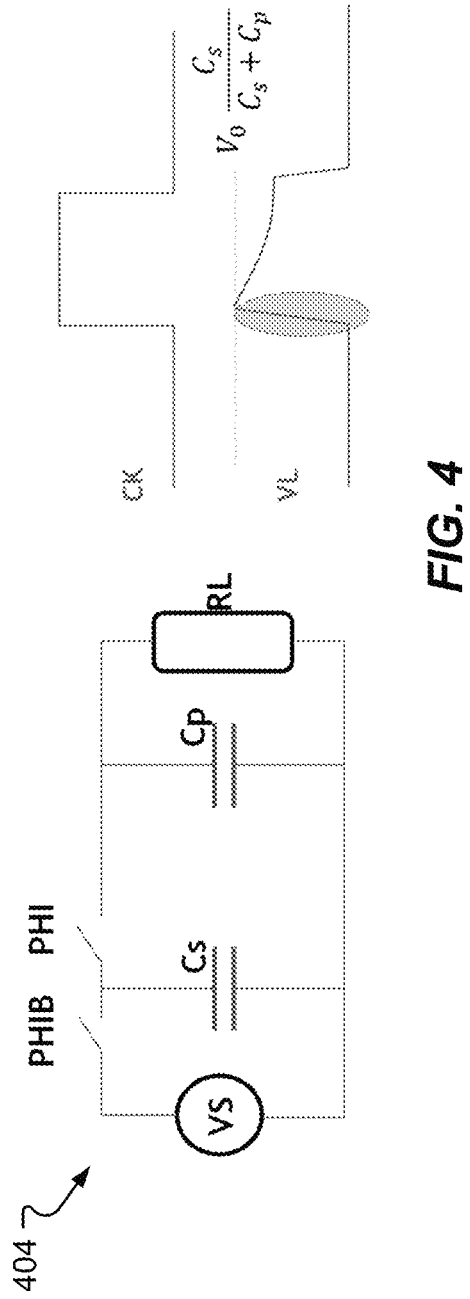
FIG. 4 illustrates a charge mode driver in accordance with at least some embodiments of the present disclosure.

FIG. 4 shows a simplified converter circuit 404 to further highlight the advantages of using digital-to-charge converters 120 in the DAC unit 116. The converter circuit 404 is shown as a simplified example of a digital-to-charge converter 120, but should not be construed as limiting embodiments of the present disclosure.

With respect to advantages offered by the converter circuit 404 as compared to a standard voltage driver, a standard voltage driver speed is limited by Intersymbol Interference (ISI), which creates jitter in both the time and voltage domain because the domains are coupled. FIR correction in a standard voltage driver is difficult because the continuous time effect cannot be perfectly corrected with a "discrete time" filter. Furthermore, a pre-driver may be required when implementing a standard voltage driver.

Use of a charge mode driver, as illustrated by the converter circuit 404, may suffer from discrete time charge sharing at the voltage domain, but is substantially free of jitter in the time domain. In other words, charge sharing between the capacitors in the array of capacitors 112 (illustrated simplistically as Cs and Cp in the converter circuit 404) may create amplitude noise, but does so without introducing timing noise. With the output signal VL produced by the converter circuit 404 being substantially free of jitter in the time domain, it becomes possible to optimally implement FIR correction since the "discrete time" effect can be corrected with a "discrete time" filter.

Another advantage of using the converter circuit 404 as illustrated in FIG. 4 is that the output signal VL has a relatively fast rise time. Where standard voltage drivers have a rise time limited by resistor RL and capacitor Cp values and have a somewhat low pass pulse shape, the converter circuit 404 exhibits a high pass pulse shape because there is a low dependency on the effective impedance of the converter circuit 404.

Figures 5A, 5B:
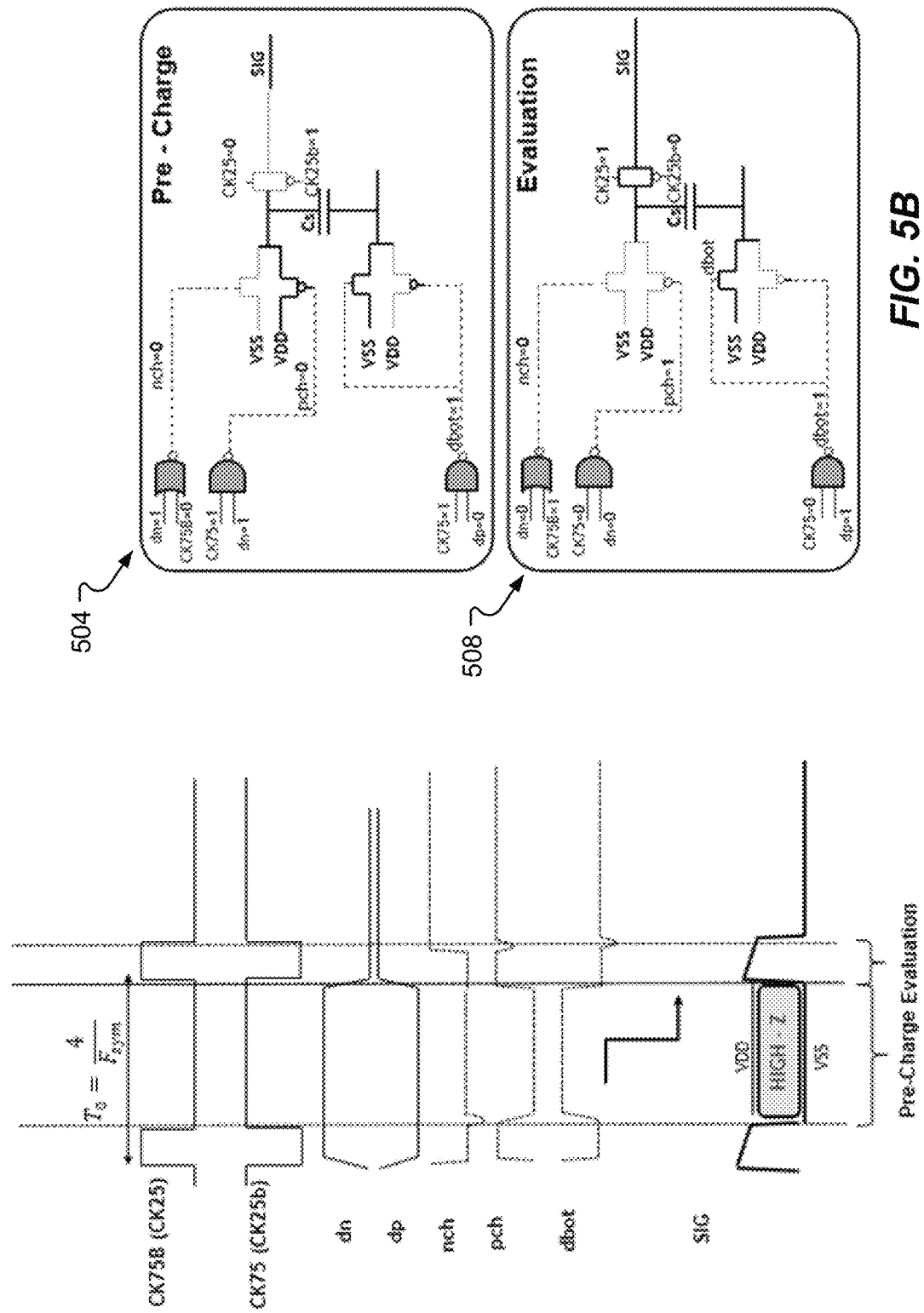
FIG. 5A illustrates another timing diagram in accordance with at least some embodiments of the present disclosure.
FIG. 5B is a circuit diagram depicting a digital-to-charge converter in two configurations in accordance with at least some embodiments of the present disclosure.
Figure 6:
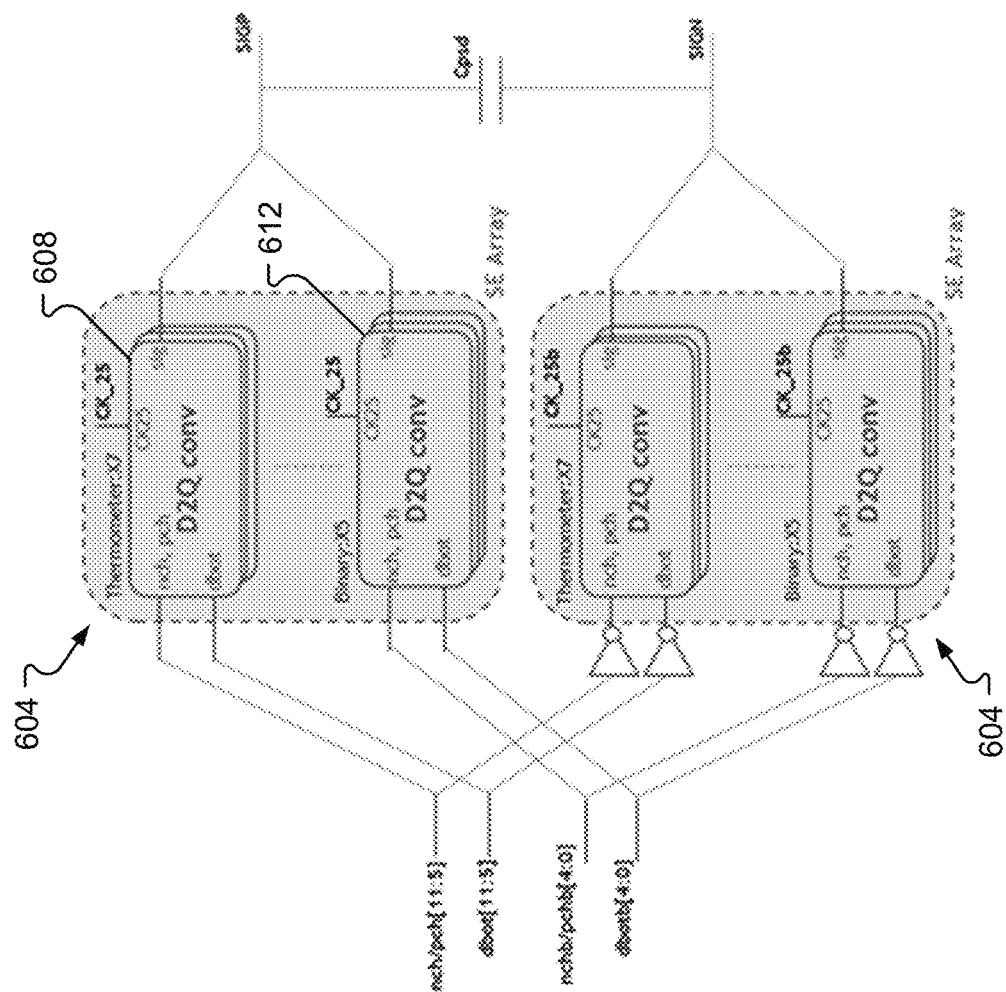
FIG. 6 is a circuit diagram depicting a collection of converter arrays in accordance with at least some embodiments of the present disclosure.

Referring now to FIGS. 5A and 5B, additional details of the operation and possible configurations of a digital-to-charge converter 120 will be described in accordance with at least some embodiments of the present disclosure. FIG. 5A illustrates the various signals provided to a digital-to-charge converter 120 and the relative timing with which each signal is provided to a particular digital-to-charge converter 120 in a DAC unit 116. In a pre-evaluation period 304, the digital-to-charge converter 120 circuit is shown in a pre-evaluation configuration 504. During the pre-evaluation period 304 for the digital-to-charge converter 120, CK75 is shown to be provided at a high value (e.g., a value of '1') and CK25 is shown to be at a low value (e.g., a value of '0'). The CMOS switches of the digital-to-charge circuit 120 gate the data (dn/dp) with CK75, which generates control signals (nch/pch/dbot) for the data T-gates. In the pre-evaluation configuration 504, a capacitors top plate 204 is charged to VDD (or VSS) and the capacitors bottom plate 208 is charged to VSS (or VDD).

After the pre-evaluation period 304, the digital-to-charge converter 120 enters into an evaluation period 308 and the circuit switches to an evaluation configuration 508. During the evaluation period 308 and while in the evaluation configuration 508, clock signal CK75 switches to a low value (e.g., a value of '0') and the clock signal CK25 switches to a high value (e.g., a value of '1'). In the evaluation configuration 508, the digital-to-charge converter 120 has the top plates 204 and/or bottom plates 208 of the capacitors shorted (e.g., to VSSA or VDDA using NOR gates). The clock signal CK25 causes the output of the digital-to-charge converter 120 to be written or output to the output voltage line 224 as the output voltage VSIG.

Referring again to FIG. 6, another possible configuration of a DAC unit 116 is shown in accordance with at least some embodiments of the present disclosure. The DAC unit 116 is illustrated to include two SE arrays 604. Each SE array 604 is built with a first set of digital-to-charge sub-unit converters 608 and a second set of digital-to-charge sub-unit converters 612. Each sub-unit converter in the first set of digital-to-charge sub-unit converters 608 and the second set of digital-to-charge sub-unit converters 612 may operate similarly to other digital-to-charge converters 120 depicted and described herein. The sub-unit converters, however, may form building blocks for each SE array 604.

In some embodiments, each sub-unit converter in the first set of digital-to-charge sub-unit converters 608 may be configured to operate on thermometer encoded bits whereas each sub-unit converter in the second set of digital-to-charge sub-unit converters 612 may be configured to operate on binary encoded bits. As a non-limiting example, the first set of digital-to-charge sub-unit converters 608 may process more significant bits of the digital input signal, which are thermometer encoded bits. Illustratively, the first set of digital-to-charge sub-unit converters 608 may receive 3-bit thermometer inputs. Meanwhile, the second set of digital-to-charge sub-unit converters 612 may process the less significant bits, which are binary encoded bits. Illustratively, the second set of digital-to-charge sub-unit converters 612 may receive 5-bit binary inputs. All outputs of the first set of digital-to-charge sub-unit converters 608 and the second set of digital-to-charge sub-unit converters 612 may be shorted to a single output pin to produce an output voltage VSIG.

Figure 7:
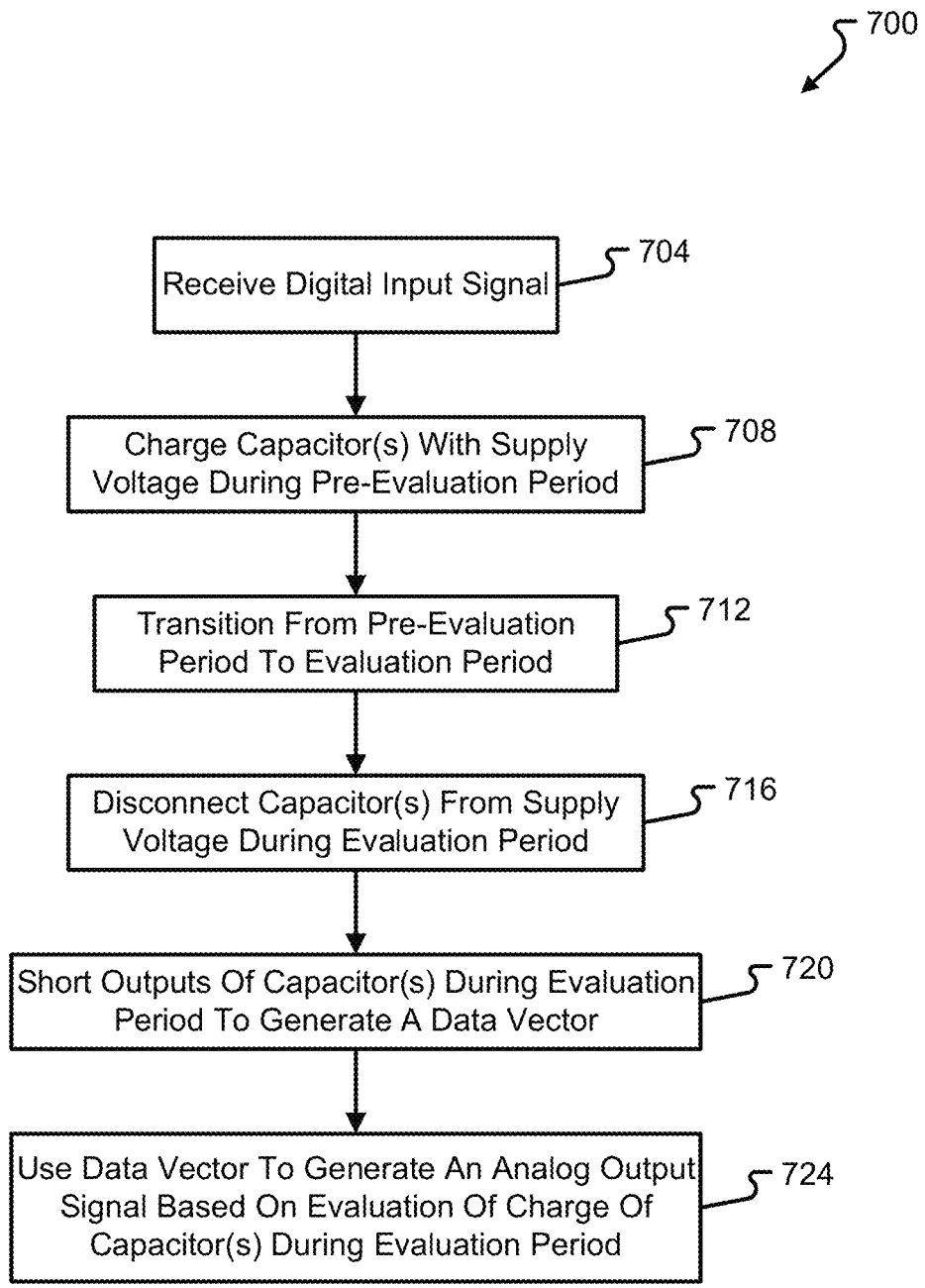
FIG. 7 is a flow diagram depicting a method of operating a digital-to-charge converter in accordance with at least some embodiments of the present disclosure.

With reference now to FIG. 7, an illustrative method 700 of operating a digital-to-charge converter 120 (or a DAC unit 116 containing a number of digital-to-charge converters 120) will be described in accordance with at least some embodiments of the present disclosure. The method 700 begins when a digital input signal is received at a digital-to-charge converter 120 (step 704). In some embodiments, the digital-to-charge converter 120 may receive the digital signal or digital vector D[m−1:0] as an input signal via a data path 112 while simultaneously receiving a clock signal PHI via a clock path 148. The data path 112 and data domain may be separated from the clock path 148 and clock domain as part of implementing the digital-to-charge converter 120.

The method 700 may continue by charging one or more capacitors of the digital-to-charge converter 120 with a supply voltage during a pre-evaluation period 304 (step 708). The capacitor(s) may be charged according to the digital signal or digital vector D[m−1:0]. During the pre-evaluation period 304, the digital-to-charge converter 120 may be in a pre-evaluation configuration 504.

The method 700 may then proceed when a clock signal PHI transitions the digital-to-charge converter 120 into an evaluation period 308 (step 712). While in the evaluation period 308, the digital-to-charge converter 120 may be in an evaluation configuration 508, where the capacitor(s) are disconnected from the supply voltage (step 716). Also while in the evaluation configuration 508, the capacitor(s) may be shorted to generate an output signal or data vector indicative of the digital signal or digital vector D[m−1:0] that was used to charge the capacitor(s) during the pre-evaluation period 304 (step 720).

The output signal or data vector generated as a result of shorting the capacitor(s) together may be used to generate an analog output signal that can eventually be output by the DAC unit 116 (step 724). In some embodiments, the analog output signal generated by one digital-to-charge converter 120 may be multiplexed without analog output signals of other digital-to-charge converters 120 in the DAC unit 116. The multiplexed analog output signals may then be subjected to bandwidth expansion by being passed through a T-coil or by using FIR.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A system, comprising:
an input that receives a digital input signal;
circuitry comprising a first digital-to-charge converter and a second digital-to-charge converter, wherein the first digital-to-charge converter is charged based on the digital input signal and holds a first charge representing a first bit value of the digital input signal during a first pre-evaluation period, wherein the second digital-to-charge converter is charged based on the digital input signal and holds a second charge representing a second bit value of the digital input signal during a second pre-evaluation period;
a first set of switches that control charging and evaluation of the first digital-to-charge converter;
a second set of switches that control charging and evaluation of the second digital-to-charge converter, wherein the second set of switches comprises multiple switches not included in the first set of switches; and
an output that enables evaluation of the first charge and second charge held in the circuitry during an evaluation period that follows the first pre-evaluation period and the second pre-evaluation period, wherein the output provides an output signal in a charge domain that is based on the evaluation of the first charge and the second charge held in the circuitry, wherein:
the first digital-to-charge converter comprises a first plurality of capacitors that are charged according to the first bit value of the digital input signal at the first pre-evaluation period, wherein the first plurality of capacitors are subject to a first charge evaluation during a first evaluation period and output a first charge value representing the first bit value; and
the second digital-to-charge converter comprises a second plurality of capacitors that are charged according to the second bit value of the digital input signal at the second pre-evaluation period that is different from the first pre-evaluation period, wherein the second plurality of capacitors are subject toe a second charge evaluation during a second evaluation period and output a second charge value representing the second bit value.

2. The system of claim 1, wherein the circuitry comprises a more than two digital-to-charge converters, wherein each digital-to-charge converter in the more than two digital-to-charge converters is charged at a different pre-evaluation period, wherein each digital-to-charge converter in the more than two digital-to-charge converters is evaluated at a different evaluation period, wherein every digital-to-charge converter in the more than two digital-to-charge converters is evaluated during each clock cycle.

3. The system of claim 2, wherein the circuitry is charged with a supply voltage and wherein each digital-to-charge converter in the more than two digital-to-charge converters converts a different bit from the digital input signal to a corresponding charge value.

4. The system of claim 3, wherein the circuitry comprises:
an array of capacitors;

one or more input switches provided between the array of capacitors and the supply voltage, wherein an open or closed position of the one or more input switches is based on the digital input signal, and wherein the one or more input switches includes at least a first switch from the first set of switches as well as at least a first switch from the second set of switches.

5. The system of claim 4, wherein the circuitry further comprises:
one or more output switches provided between the array of capacitors and the output, wherein an open or closed position of the one or more output switches depends upon whether a charge converter is currently in a pre-evaluation period or an evaluation period, and wherein the one or more output switches includes at least a second switch from the first set of switches as well as at least a second switch from the second set of switches.

6. The system of claim 1, wherein the circuitry further comprises:
a third digital-to-charge converter having a third plurality of capacitors that are charged according to a third bit value of the digital input signal at a third pre-evaluation period that is different from the first pre-evaluation period and the second pre-evaluation period, wherein the third plurality of capacitors are subject to a third charge evaluation during a third evaluation period and output a third charge value representing the third bit value; and
a fourth digital-to-charge converter having a fourth plurality of capacitors that are charged according to a fourth bit value of the digital input signal at a fourth pre-evaluation period that is different from the first pre-evaluation period, the second pre-evaluation period, and the third pre-evaluation period, wherein the fourth plurality of capacitors are subject to a fourth charge evaluation during a fourth evaluation period and output a fourth charge value representing the fourth bit value.

7. The system of claim 1, wherein the first plurality of capacitors are shorted together during the first evaluation period, and wherein the first charge evaluation provides a first data vector that is converted to voltage by a charge sharing of the first plurality of capacitors.

8. The system of claim 1, wherein a first analog output generated based on the first charge evaluation is multiplexed with a second analog output generated based on the second charge evaluation.

9. The system of claim 1, wherein a length of the evaluation period and a length of the first pre-evaluation period and a length of the second pre-evaluation period combine to approximately a cycle of the digital input signal.

10. The system of claim 1, wherein the circuitry comprises:
a capacitor; and
one or more transistors provided between the capacitor and a supply voltage, wherein the one or more transistors are controlled based on the digital input signal to charge the capacitor with the supply voltage when the digital input signal corresponds to a predefined digital value, and to not charge the capacitor with the supply voltage when the digital input signal corresponds to a value other than the predefined digital value.

11. A high-speed digital-to-analog converter (DAC) configured to convert an m-bit digital input signal into an analog output signal, the high-speed DAC comprising:
an input that receives the m-bit digital input signal;
an output that provides the analog output signal;
a plurality of digital-to-charge converters provided between the input and the output, the plurality of digital-to-charge converters comprising a first digital-to-charge converter and a second digital-to-charge converter, wherein each of the plurality of digital-to-charge converters comprise one or more capacitors, wherein the one or more capacitors are charged based on the m-bit digital input signal during a pre-evaluation period, wherein a charge stored by the one or more capacitors is evaluated during an evaluation period that follows the pre-evaluation period, wherein the plurality of digital-to-charge converters receive control signals that coordinate the evaluation period and the pre-evaluation period to convert each bit of the m-bit digital input signal into a different charge value, and wherein the analog output signal is generated based on the evaluation of the charge stored by the one or more capacitors during the evaluation period;
a first plurality of switches that independently control a timing of the pre-evaluation period and the charging of the one or more capacitors; and
a second plurality of switches that independently control a timing of the evaluation period and the evaluation of the one or more capacitors, wherein:
the first digital-to-charge converter comprises a first plurality of capacitors that are charged according to a first bit value of the m-bit digital input signal at a first pre-evaluation period, wherein the first plurality of capacitors are subject to a first charge evaluation during a first evolution period and output a first charge value representing the first bit value; and
the second digital-to-charge converter comprises a second plurality of capacitors that are charged according to a second bit vale of the m-bit digital input signal at a second pre-evaluation period that is different from the first pre-evaluation period, wherein the second plurality of capacitors are subject to a second charge evaluation during a second evaluation period and output a second charge value representing the second bit value.

12. The high-speed DAC of claim 11, wherein a number of digital-to-charge converters in the plurality of digital-to-charge converters corresponds to a number of bits, M, in the m-bit digital input signal.

13. The high-speed DAC of claim 12, wherein each of the number of digital-to-charge converters comprise an array of binary-weighted capacitors, and wherein each of the number of digital-to-charge converters are operated at a clock speed of M divided by a symbol frequency in the m-bit digital input signal.

14. The high-speed DAC of claim 11, wherein each digital-to-charge converter in the plurality of digital-to-charge converters is evaluated during a different evaluation period that does not overlap with an evaluation period of any other digital-to-charge converter in the plurality of digital-to-charge converters.

15. The high-speed DAC of claim 11, wherein the first plurality of switches also control a supply voltage provided to the one or more capacitors and whether or not the supply voltage is used to charge the one or more capacitors during the pre-evaluation period.

16. A method of operating a digital-to-charge converter, the method comprising:
receiving a digital input signal;
charging a first plurality of capacitors during a first pre-evaluation period according to a first bit value of the digital input signal at a first pre-evaluation period, wherein the first plurality of capacitors are part of a first digital-to-charge converter, wherein the first plurality of capacitors are charged with a supply voltage via at least a first switch in a first set of switches based the digital input signal;

charging a second plurality of capacitors during a second pre-evaluation period according to a second bit value of the digital input signal at a second pre-evaluation period, wherein the second plurality of capacitors are part of a second digital-to-charge converter, wherein the second plurality of capacitors are charged with the supply voltage via at least a first switch in a second set of switches based on the digital input signal;

changing a state of the at least the first switch in the first set of switches thereby disconnecting the first plurality of capacitors from the supply voltage during a first evaluation period;

enabling an evaluation of charge of the first plurality of capacitors during the first evaluation period via a second switch in the first set of switches;

changing a state of the at least the first switch in the second set of switches thereby disconnecting the second plurality of capacitors from the supply voltage during a second evaluation period;

enabling an evaluation of charge of the second plurality of capacitors during the second evaluation period via a second switch in the second set of switches; and generating an analog output signal from the digital-to-charge converter based on the evaluation of charge of the first plurality of capacitors during the first evaluation period as well as the second plurality of capacitors during the second evaluation period, wherein the first plurality of capacitors output a first charge value representing the first bit value during the first evaluation period, and wherein the second plurality of capacitors output a second charge value representing the second bit value during the second evaluation period.

17. The method of claim 16, further comprising:
controlling the first set of switches and the second set of switches with at least one of a clock signal and the digital input signal.

18. The method of claim 16, further comprising:
shorting outputs of the first plurality of capacitors together during the first evaluation period; and
generating a data vector based on a measure of charge generated by shorting the outputs of the first plurality of capacitors, wherein the data vector is used to generate the analog output signal.

19. The method of claim 16, wherein a length of the first evaluation period, a length of the second evaluation period, a length of the first pre-evaluation period, and a length of the second pre-evaluation period combine to approximately a cycle of the digital input signal.

* * * * *